June 8, 1965 T. B. HUTCHINS IV., ETAL 3,188,244

METHOD OF FORMING PN JUNCTION IN SEMICONDUCTOR MATERIAL

Filed April 24, 1961

INVENTORS.

Jean F. DeLord
Thomas B. Hutchins IV
William C. Myers

BY Buckhorn, Cheatham & Blore

ATTORNEYS

United States Patent Office 3,188,244

Patented June 8, 1965

3,188,244

METHOD OF FORMING PN JUNCTION IN SEMICONDUCTOR MATERIAL

Thomas B. Hutchins IV, Beaverton, Jean F. Delord, Portland, and William C. Myers, Hillsboro, Oreg., assignors to Tektronix, Inc., Beaverton, Oreg., a corporation of Oregon Filed Apr. 24, 1961, Ser. No. 105,126
5 Claims. (Cl. 148—1.5)

This invention relates to a method and apparatus for controlling the concentration of impurities in conductive materials and more particularly to a method and apparatus in which conductive material is first melted by the application of heat, an electrical potential or field is then applied across the melted conductive material to cause controlled migration of ionized impurities therein, and finally the conductive material is cooled below its melting point while continuing to apply the electrical field. The invention may be employed specifically in processes for refining or purifying conductive material, and is particularly adaptable for use in the well known "zone-refining" process of purifying semiconductor material for example. Another specific application of the invention is in the formation of PN-type junctions in semiconductive material so that the thickness of said junctions may be controlled for the manufacture of semiconductor devices, such as tunnel diodes, transistors and the like.

The problem of purifying or refining conductive materials has been present in the metal working art for years. However, with the invention of the junction transistor and the resulting need for highly purified semiconductor materials, this problem has grown to even greater proportions because the extent of purification required for semiconductor devices is approximately one part impurity in one million parts of semiconductor material. This led to a standard method of purification called "normal freezing" in which all of the semiconductor material being purified is melted so as to be in liquid form. The liquid semiconductor material is then cooled gradually in a progressive maner, starting at one end of the liquid semiconductor material so that the material is progressively solidified from one end to the other. This method makes use of the fact that many impurities tend to remain in the liquid material and therefore concentrate in the last portion of the semiconductor material to solidify. This portion containing a high concentration of impurities is then removed by cutting or some other procedure giving similar results. An improvement on the normal freezing process is a purification technique called "zone refining." Here the semiconductor material is not completely melted as in the normal freezing process but is only heated in a narrow zone so that melting is restricted to this zone. This molten zone is then caused to traverse the length of a bar or ingot of semiconductor material which is to be purified. This has the advantage that several successive passes may be made by the molten zone without removing the ingot for cutting between each melting, as is necessary in normal freezing processes since completely remelting the ingot without cutting would cause the concentrated impurities to disperse and spread throughout the bar. Also a plurality of heating zones may be provided so that several traverse the bar at the same time. However, in order to get the desired purification and obtain the low impurity to semiconductor material ratio mentioned above, several passes must be made with the whole process taking several hours to complete, so that zone-refining is still a very costly process.

The present invention employs an electric field to improve the results obtained by the above-discussed processes and is effective to produce a higher ultimate purification or to produce substantially the same purifications with less expense than such processes discussed above. It has been found that impurities in the molten semiconductor material ionize and that the application of an electrical potential or field changes the effective segregation coefficient of said impurities. That is to say, the electric potential causes ions of one polarity to migrate in the same direction as the travel of the zone so that they tend to remain in the fused portion of the material while ions of opposite polarity migrate in the opposite direction and remain in the portion which solidifies. This causes a greater amount of certain impurities to concentrate in the molten zone as it traverses the length of the ingot and even causes some impurities to be carried along by said zone which would not ordinarily be so carried. Reversal of the field on subsequent passes removes other impurities which then remain in the molten material. The result is that fewer passes are necessary to attain the high degree of purification required and also that the ultimate limit of purification is made higher than it was before the present invention.

Another problem closely related to that discussed above occurs in the formation of PN junctions in semiconductor devices. It is always desirable to control the thickness of said junctions and in many cases, such as the tunnel diode, it is particularly desirable to make these junctions as thin as possible. Such a PN junction is usually produced by forming a fused body of semiconductor material containing a doping impurity in contact with a solid body of semiconductor material containing a doping impurity of a type opposite to that in the fused material, and cooling the fused semiconductor material until the melted portion in contact with the solid portion recrystallizes into the form of single crystalline semiconductor material doped oppositely from that of the original solid semiconductor material. Since the predominant current-carriers in the original piece of semiconductor material and the recrystallized semiconductor material are of opposite types, a PN junction is formed therebetween. The width of this junction is determined by many things, one of which is the depth of the diffusion into the piece of solid semiconductor material of the doping impurity from the fused material in contact with the solid semiconductor material. Heretofore it was known that this diffusion could be controlled somewhat by varying the time-temperature heating cycle of the semiconductor material but this technique has proven to be inadequate and time consuming.

It has been found that the depth of the diffusion discussed above can be controlled to a substantial degree by the application of an electric field across the liquid semiconductor material independently of the heating cycle, because of the ionization of the impurities contained therein also discussed above. In order to form a narrow junction, the biasing voltage applied across the liquid semiconductor material should have a polarity such that the added impurity ions contained therein will migrate away from the oppositely doped solid semiconductor material so as to be prevented from penetrating very deeply into the solid semiconductor material. The result is that a much more narrow junction can be formed than was possible prior to the present invention. In order to form a wide junction, the biasing voltage can merely be reversed in order to cause the added doping impurity ions to migrate toward solid semiconductor material so that they penetrate to an even greater depth into the solid semiconductor material than before the biasing voltage was applied. The result of this process is that a PN-type junction may be formed with a controlled thickness so that the performance of the semiconductor device in which this material is incorporated may also be controlled. Such a bias voltage may be employed with advantage in any method of forming PN-type junctions in which a fused layer or body of semiconductor material containing doping impurities is formed in contact with an oppositely doped body of solid semiconductor material. Two methods employing such a bias voltage are hereafter specifically discussed. They are the well known alloying or fusion method and the method in which the junction is formed during growth of a single crystal of semiconductor material. Both methods can be modified by the employment of a bias voltage to control the thickness of the PN junctions.

It is therefore an object of the present invention to provide a method and apparatus for controlling the concentration of impurities in conductive material by the use of an electric field.

Another object of this invention is to provide a method and apparatus for refining conductive material to a high condition of purity by the use of an electric field.

A further object of the present invention is to provide a method of refining semiconductor material by removing impurities with the assistance of an electric field.

Another object of the invention is to provide a method and apparatus for forming a PN-type junction with a controlled thickness in semiconductor material by the use of an electrical field.

An additional object of the present invention is to provide a method and apparatus for forming a plurality of PN-type junctions with controlled thicknesses in semiconductor material so that semiconductor devices made therefrom will function in a more uniform and controlled manner.

These and other objects and advantages will be apparent from the following description of preferred embodiments of the invention shown in the attached drawings of which:

FIGS. 1*a*, 1*b* and 1*c* are diagrammatic views illustrating a preferred embodiment of the invention employing different method steps used in an improved process for the formation of PN-type junctions in a semiconductor material by fusion or alloying;

Figure 4A:
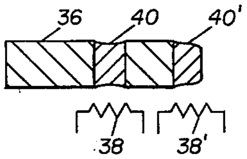
Figure 4B:
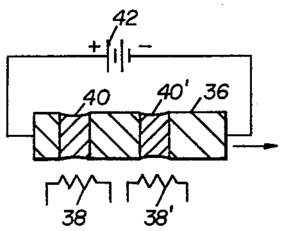
Figure 4C:
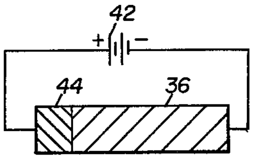
Figure 5A:
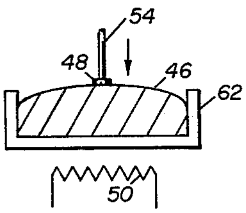
Figure 5B:
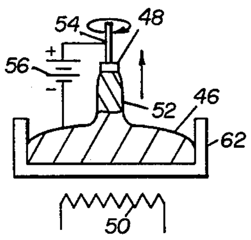
Figure 5C:
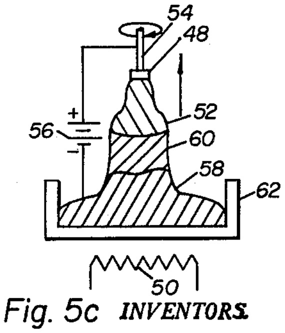

FIGS. 4*a*, 4*b* and 4*c* are diagrammatic views illustrating an embodiment of the invention in which separate method steps are employed in an improvement of the zone refining process of purifying semiconductor material; and FIGS. 5*a*, 5*b* and 5*c* are diagrammatic views illustrating another embodiment of the invention including an improved method of forming a PN-type junction in semiconductor material in which the junction is formed by adding doping impurities to the liquid melt used in the growth of a single crystal of said semiconductor material.

Figure 1A:
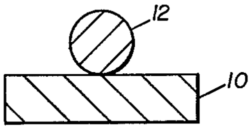
Figure 1B:
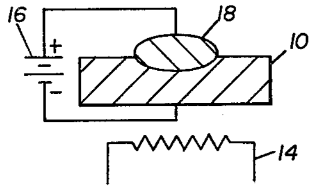
Figure 1C:
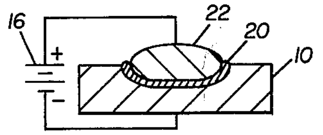

Referring to FIGS. 1*a*, 1*b* and 1*c* of the drawings, the embodiment of the invention shown therein relates to a method of forming a fusion or alloy type PN junction in semiconductor material. The method whose essential steps are illustrated in these figures employs a solid piece of doped semiconductor material 10. A solid element of doping impurity 12, which is of opposite type from that already contained in the semiconductor material 10, is placed on and in contact with such piece of semiconductor material. The semiconductor material used in piece 10 may be germanium, silicon or an inter-metallic compound, such as gallium arsenide, which has been previously doped with a donor or an acceptor impurity having more or less valence electrons respectively than the semiconductor material. Common doping impurities used are indium, gallium, boron or aluminum as accepter impurities; and phosphorous, arsenic or antimony as donor impurities. Also it may be desirable to use a doping alloy of two or more donor impurities or accepter impurities. One preferred embodiment is to make the piece of doped semiconductor material 10 out of a compound of gallium arsenide which is then doped with zinc to create an N-type semiconductor material and to make the element 12 of a P-type doping impurity, such as tin.

The piece 10 and the element 12 may be heated, as illustrated in FIG. 1*b*, by means of an electrical heating coil 14. The temperature is raised above the melting point of element 12 or the eutectic temperature of the combined materials so that it completely melts and wets the underlying piece 10 which then partially melts in the region wetted by reason of eutectic formation. A source of D.C. biasing voltage 16 is applied across the resulting liquid eutectic 18 so as to be controllable independently of the heating operation. If a narrow PN-type junction is desired, the polarity of D.C. voltage source 16 is as indicated in FIG. 1*b* when the current carrier impurities from element 12 form negative ions. That is to say, it has been found that the impurities in the resulting body 18 of liquid material ionize, and that the position of such ions in the liquid eutectic 18 is affected by the application of an electrical field produced by voltage source 16. Since the predominant doping impurities in liquid eutectic 18 in the example being discussed are of a P-type while the element 10 contains N-type doping impurities, the biasing voltage should be of the correct polarity to attract P-type impurity ions away from piece 10 in order to limit their diffusion into piece 10, and is preferably applied until the molten material solidifies.

In FIG. 1*c*, the liquid material has been cooled below its melting temperature while continuing to apply the appropriate D.C. bias voltage. This results in the forming of a recrystallized solid layer 20 of single crystalline semiconductor material doped as a P-type material, and a solidified layer 22 usually consisting of a polycrystalline mixture of crystallized eutectic and semiconductor material. The PN-type junction formed between the recrystallized layer 20 and piece 10 has substantially less thickness than PN junctions formed by previously known methods of fusion or alloying. If it is desired to form a PN junction having a thickness greater than that formed in known fusion or alloying techniques, it is only necessary to reverse the polarity of D.C. voltage source 16. It should also be obvious from the above discussion that any number of PN-type junctions may be formed on the semiconductor piece 10 and that any method of forming them may be used so long as a fused body of semiconductor material and doping impurity is produced during the formation of the PN junction so that current carrier impurities in the resulting liquid material are ionized.

Figure 2:
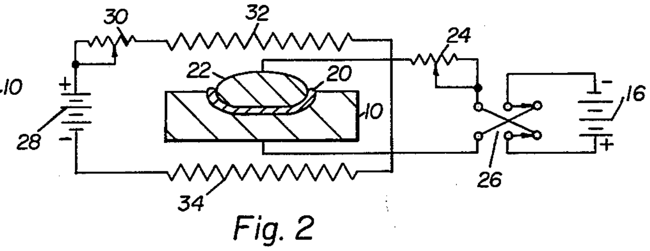
FIG. 2 is a diagrammatic view showing apparatus for carrying out the method of FIGS. 1*a*, 1*b* and 1*c* using separate circuits for heating and applying an electrical field to the semiconductor material.

FIG. 2 shows diagrammatically an apparatus which may be used to carry out the method of FIGS. 1*a*, 1*b* and 1*c*. This apparatus includes two independent electrical circuits of which one supplies the D.C. bias voltage and the other functions to heat the semiconductor material. The D.C. bias voltage circuit consists of a source of D.C. voltage 16 and a variable resistor 24 connected in series between the D.C. voltage source 16 and the semiconductor piece 10. A switch means 26 is connected across the voltage source 16 for reversing the polarity of the D.C. bias voltage applied, while the function of variable resistor 24 is to vary the value of the D.C. voltage applied across piece 10. The heater circuit consists of a source of A.C. or D.C. heater voltage 28 connected in series with a rheostat 30 and heating coils 32 and 34. These heating coils may be resistance heaters which melt the semiconductor material either by heat radiation nor conduction, or they may be induction heating coils using a source of RF voltage. The function of rheostat 30 is to vary the current applied to the heating coils and thereby vary the heat emitted therefrom. It should be noted that these two separate circuits enable independent control of the heating cycle of the semiconductor material and of the application of bias voltage across said semiconductor material.

Figure 3:
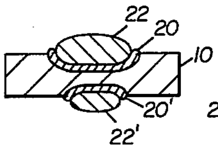
FIG. 3 is a diagrammatic view showing a partially completed semiconductor device having two PN junctions therein formed by the method of FIGS. 1*a*, 1*b* and 1*c*.

FIG. 3 shows a semiconductor device made by the method and apparatus shown in FIGS. 1 and 2. This illustrates that a plurality of PN junctions may be formed on a single piece 10 of semiconductor material so that transistors or other multi-junction devices may be formed using the above described bias voltage technique. As shown, this device includes a piece of N-doped semiconductor material 10 having two P-doped recrystallized layers 20 and 20' of single crystalline semiconductor material in contact with piece 10 and forming PN junctions therewith. Solidified layers 22 and 22' of a polycrystalline mixture of eutectic and semiconductor material cover recrystallized layers 20 and 20' respectively. As a specific example, the transistor collector 20 may be approximately 40 to 60 mils wide, while base 10 may be approximately 4 to 10 mils thick at its outer surface and approximately 1 mil thick between the two junctions, and emitter 20' may be about 15 to 30 mils wide. It should be noted that nearly planar, parallel junctions can be formed by this embodiment of the invention.

Another embodiment of the present invention is illustrated in FIGS. 4*a*, 4*b* and 4*c*. These figures show the application of the bias voltage technique to a method of purifying conductive materials in general, and semiconductor materials in particular, called "zone refining." As indicated in FIG. 4*a*, a bar 36 of semiconductor material containing current carrier impurities therein is heated by two heating coils 38 and 38' so that narrow molten zones 40 and 40' are formed in the bar 36. An electrical field is established across these molten zones in FIG. 4*b* by applying a source of D.C. bias voltage 42 across the bar of semiconductor material 36. The bar 36 and the heating coils 38 and 38' are moved relative to one another, as indicated by the arrow in FIG. 4*b*, so that the molten zones 40 and 40' traverse the whole length of bar 36 from one end to the other while continuing to apply the bias voltage. The current carrier impurities which concentrate in the liquid semiconductor material rather than in the solid semiconductor material are carried along by molten zones 40 and 40' and deposited in the bar 36 forming a region 44 of high impurity content as shown in FIG. 4*c*. This process may be repeated several times until the desired degree of purity has been reached in semiconductor material 36. Then the region of high impurity 44 is removed by cutting or some related process. Of course zone refining per se is well known in the art of purifying semiconductor materials. As discussed above however, it has been found that impurities in the molten zones 40 and 40' are ionized so that the application of an electric field having the proper polarity will cause certain impurities to migrate in the direction of travel of the zones and therefore concentrate in the liquid semiconductor material to a greater extent than before the application of the electrical field. With the bar 36 moving to the right and the polariy of voltage source 42 as indicated, the negatively ionized impurities are attracted to the left and more of them are carried along by melting zones 40 and 40' thereby removing them from the solid material. In order to assist in removing impurities ionizing in an opposite manner, the polarity of the D.C. voltage source 42 can be reversed in subsequent zone refining operations.

Another embodiment of the invention is illustrated in FIGS. 5*a*, 5*b* and 5*c*, which illustrate an improvement in the forming of a PN junction in semiconductor material as the semiconductor material is being grown into a single crystal form from a liquid melt of semiconductor material. In FIG. 5*a*, a seed crystal 48 of the desired lattice orientation is first brought into contact with liquid melt 46 of N-doped semiconductor material. The seed crystal 48 is then pulled away from the surface of the melt slowly as indicated in FIG. 5*b* so that some of the liquid melt 46 adheres to the seed crystal and is drawn away from the melting zone heated by heater 50. A recrystallized area 52 of N-doped single crystalline semiconductor material is formed having a lattice orientation similar to seed crystal 48 on which it is grown. In order to stir the melt it is the general practice to rotate the seed crystal 48 at a speed of the order of 100 r.p.m. by turning supporting shaft 54. In accordance with the present invention, a source of D.C. bias voltage 56 is applied between the solid semiconductor material 52 and the liquid melt 46. A P-type doping impurity is then added to liquid melt 46 thereby changing the conductive characteristics of the melt so that it is now predominantly doped with a P-type impurity. As indicated in FIG. 5*c*, the pulling of seed crystal 48 away from the melt is continued with the D.C. bias voltage being applied so that P-doped liquid semiconductor material is withdrawn from the P-doped melt 58 out of the melting zone until it recrystallizes into an area 60 of P-doped single crystalline semiconductor material. A PN junction has now been grown between recrystallized area 52 and recrystallized area 60. The thickness of this junction is controlled by application of D.C. bias voltage 56 during growth. The D.C. bias voltage acts on the ionized current carrier impurities in the liquid to cause them to migrate toward or away from the junction, as described above with respect to the formation of alloy type PN junctions. By successively adding different types of doping materials the process can be continued until several such junctions are formed during growth of the single crystal and until all of the liquid melt is withdrawn from container 62.

Another way of forming PN junctions during crystal growth using the D.C. bias voltage technique involves initially providing substantially equal amounts of both P-type and N-type doping impurities in the liquid melt of semiconductor material. By employing P-type and N-type impurities which ionize with opposite polarities, the bias voltage applied between the seed crystal 48 and the melt 46 will cause the recrystallized solid semiconductor material drawn from the melt by the seed to have P or N-type conductivity depending upon the polarity of the voltage, as discussed previously. In order to form a PN junction in the recrystallized semiconductor material, it is then only necessary to reverse the polarity of the bias voltage while continuing to withdraw the material from the melt without adding any additional doping impurities. In this manner a plurality of successive PN junctions may be formed during crystal growth without requiring the addition of compensating impurities to change the type of conductivity of the melt for each junction which is necessary in conventional doping methods. As a result, there is a substantial saving in the amount of doping impurities required, along with the elimination of a need to add exactly measured quantities of a compensating impurities to change the melt conductivity. However, an even more important advantage lies in the fact that the number of junctions which can be formed by the conventional methods mentioned is limited due to the fact that increased compensating impurity content gives inferior semiconductor properties, such as carrier lifetime and mobility, and this problem is eliminated by the method of the present invention.

In all of the above-discussed embodiments of the invention a body of molten conductive material in contact with a body of solid conductive material is cooled or allowed to cool so as to solidify while an electric potential is maintained across the portion of the molten material adjacent the solid material. That is to say, the potential is maintained between connections or electrodes making contact with the solid and liquid material at positions on opposite sides of such portion of the molten material so that ions in that portion migrate toward or away from the contact between the molten material and solid material. The potential applied will depend upon the materials being treated, but must be less than that which will cause electron current to flow in an amount causing resistance heating which will maintain the molten conductive material in such molten conditions thus preventing the required solidification of such molten material. It will be apparent in some cases that either A.C. or D.C. resistance heating can be employed either in whole or in part to initially cause melting of the molten material. The cooling operation of the present invention is, however, carried out while a D.C. bias potential, less than that which will cause the molten material to remain molten because of resistance heating, is maintained across the molten material in contact with solid material while such molten material is solidifying. Such D.C. bias potential may also be employed during the initial heating cycle or during any desired time and temperature treatment if independent heating, such as by conduction or radiation, is employed.

The D.C. bias potential causes the migration of impurity ions, above discussed, and under any given set of conditions the results are reproducible although the polarity of the ions of a given impurity will depend upon such factors as the nature of the particular semiconductor or other conducting material which forms the molten phase and the impurities in solution therein.

It should be noted that all of the above processes involving melting semiconductor material into a liquid form must, in general, be carried out in a protective atmosphere of inert gas or in a relatively high vacuum in order to prevent contamination of the highly purified semiconductor material by impurities present in the air. Also, these processes may all be performed by using the same general apparatus shown in FIG. 2.

It is to be understood that applying a bias voltage across a molten portion of conductive material in contact with a zone of solid conductive material in order to effect the concentration of impurities in the molten conductive material or their penetration into the solid material may be applied to any molten phase-solid phase process and is not limited to the refining of semiconductor material or to forming PN junctions therein, but may be applied to the refining of metals or other related processes. Although several specific embodiments of this invention have been shown and described, it will be understood that they are but illustrative of the present invention, and that various modifications may be made therein without departing from the spirit and scope of the invention.

We claim:

1. A method of forming a PN-type junction in semiconductor material comprising:
   heating semiconductor material containing a doping impurity therein above its melting temperature until it becomes at least partially liquid,
   adding to this liquid portion a doping impurity of a type opposite to that already contained therein while continuing to apply said heat so that the doping impurities are melted and ionized,
   applying an electrical potential across said liquid portion independently of said heating so that ions of the doping impurity opposite in type to that originally contained in said semiconductor material migrate away from the solid semiconductor material, and
   cooling said liquid portion below its melting temperature while continuing to apply said electrical potential so that a PN-type junction of controlled thickness is formed between said solid semiconductor material and said portion after said portion recrystalizes into the form of a doped single crystalline semiconductor material having current carriers of a type opposite that contained in said solid semiconductor material.

2. A method of forming a PN-type junction in semiconductor material comprising:
   contacting a piece of semiconductor material containing a first type of doping impurity therein with an element of a second type of doping impurity of opposite conductivity,
   heating said piece and said element until said element is completely melted and a layer of oppositely doped liquid containing ionized doping impurities is formed on the surface of said piece,
   applying a D.C. bias voltage across said layer independently of said heating to cause the controlled migration of the ionized doping impurities, and
   cooling said layer below its melting temperature while continuing to apply said voltage in order to form a PN junction of controlled thickness between said piece and said layer.

3. A method of forming a plurality of PN junctions in semiconductor material comprising:
   contacting one surface of a piece of semiconductor material containing a first doping impurity therein with an element of a second doping impurity of opposite conductivity,
   heating said piece and said element until a layer of oppositely doped liquid containing ionized doping impurities is formed of the material in said piece and said element on the surface of said piece,
   applying a D.C. bias voltage across said layer independently of said heating to cause the controlled migration of the ionized second impurity,
   cooling said layer below its melting temperature while continuing to apply said D.C. bias voltage in order to form a PN junction of controlled thickness between said piece and said layer, and repeating the above process upon the opposite surface of said piece of semiconductor material so that a plurality of PN junctions of controlled thickness are formed.

4. A method of forming a PN junction in semiconductor material comprising:
   positioning a piece of single crystalline semiconductor material containing a first doping impurity therein adjacent to an element of a second doping impurity of a type opposite to that already present in said piece,
   heating said piece and said element in order to melt their adjacent surfaces and form a layer of liquid eutectic between said surfaces which contains a solution of the materials present in both said piece and said element including ionized doping impurities with the second doping impurity being present in a greater amount than that from said piece,
   applying a D.C. bias voltage across said liquid layer independently of said heating to cause the controlled migration of said second type of doping impurity, and
   cooling said layer below its melting temperature while continuing to apply said D.C. voltage so that a PN junction of controlled thickness is formed between said piece and said finally recrystallized layer.

5. A method of forming a PN junction in semiconductor material comprising:
   positioning a piece of single crystalline semiconductor material containing a first doping impurity therein adjacent to an element containing a second doping impurity which will add current carriers of a type opposite to that already present in said piece,
   heating said piece and said element in a protective atmosphere of inert gas in order to melt their adjacent surfaces and form a layer of liquid eutectic between said surfaces which contains a solution of the materials present in both said piece and said element including ionized doping impurities with the second doping impurity being present in a greater amount than that from said piece,
   applying a D.C. bias voltage across said layer independently of said heating to cause the controlled migration of said second impurity in a direction determined by the polarity of said bias voltage, and
   cooling said layer below its melting temperature while continuing to apply said D.C. bias voltage so that a PN-type junction of controlled thickness is formed between said piece and said layer after said layer recrystallizes into the form of a doped single crystalline semiconductor material.

References Cited by the Examiner

UNITED STATES PATENTS

| | | | |
|---|---|---|---|
| 1,884,585 | 10/32 | Crossley | 219—19 |
| 1,950,246 | 3/34 | Hyland | 219—19 |
| 2,475,810 | 7/49 | Theurer | 148—1.5 |
| 2,711,379 | 6/55 | Rothstein | 148—1.5 |
| 2,789,039 | 4/57 | Jensen | 148—1.6 |
| 2,792,538 | 5/57 | Pfann | 148—1.5 |
| 2,807,558 | 9/57 | Pankove | 117—23 |
| 2,847,336 | 8/58 | Pankove | 148—1.5 |
| 2,854,318 | 9/58 | Rummell | 148—1.6 |
| 2,892,740 | 6/59 | Coomes et al. | 148—1.6 |
| 2,904,411 | 9/59 | Pfann | 148—1.6 |
| 2,943,006 | 6/60 | Henkels | 148—1.6 |
| 2,967,111 | 1/61 | Coghill et al. | 117—106 |
| 2,975,345 | 3/61 | Koller | 117—107 |
| 2,999,776 | 9/61 | Dorendorf et al. | 148—1.6 |
| 3,011,877 | 12/61 | Schweickert et al. | 148—1.6 |

FOREIGN PATENTS

| | | |
|---|---|---|
| 212,698 | 5/57 | Australia. |

OTHER REFERENCES

Holden: Preparation of Metal Single Crystals, ASM Preprint No. 35, 1949, page 14.

DAVID L. RECK, *Primary Examiner.*

OSCAR R. VERTIZ, HYLAND BIZOT, *Examiners.*